United States Patent
Huang et al.

(10) Patent No.: US 11,711,893 B2
(45) Date of Patent: Jul. 25, 2023

(54) ELECTRONIC COMPONENT, VOLTAGE REGULATION MODULE AND VOLTAGE STABILIZER

(71) Applicant: SHENNAN CIRCUITS CO., LTD., Shenzhen (CN)

(72) Inventors: Lixiang Huang, Shenzhen (CN); Jin Dong, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 194 days.

(21) Appl. No.: 17/477,534

(22) Filed: Sep. 17, 2021

(65) Prior Publication Data
US 2023/0007776 A1 Jan. 5, 2023

Related U.S. Application Data

(63) Continuation of application No. PCT/CN2021/103812, filed on Jun. 30, 2021.

(51) Int. Cl.
*H05K 1/18* (2006.01)
*H05K 1/11* (2006.01)

(52) U.S. Cl.
CPC .............. *H05K 1/185* (2013.01); *H05K 1/115* (2013.01); *H05K 1/181* (2013.01)

(58) Field of Classification Search
CPC ........ H05K 1/185; H05K 1/115; H05K 1/181; H05K 2201/10515; H05K 2201/10651
See application file for complete search history.

(56) References Cited

U.S. PATENT DOCUMENTS

| | | | |
|---|---|---|---|
| 5,783,870 A | 7/1998 | Mostafazadeh et al. | |
| 10,362,667 B2* | 7/2019 | Min | H05K 1/0204 |
| 10,643,928 B2* | 5/2020 | Tuominen | H01L 23/49816 |
| 2002/0191366 A1 | 12/2002 | Naito et al. | |

FOREIGN PATENT DOCUMENTS

| | | |
|---|---|---|
| CN | 1575108 A | 2/2005 |
| CN | 103489632 A | 1/2014 |
| CN | 107068351 A | 8/2017 |
| CN | 112203413 A | 1/2021 |

OTHER PUBLICATIONS

International search report, International Application No. PCT/CN2021/103812, dated Sep. 28, 2021 (10 pages).

* cited by examiner

*Primary Examiner* — Sherman Ng

(57) ABSTRACT

The present disclosure relates to an electronic component, a voltage regulation module and a voltage stabilizer. The electronic component may include a substrate, a first electronic element and a second electronic element. The substrate may be provided with a first surface and a second surface that are opposite to each other. The first electronic element may be embedded in the substrate, and may be provided with a first electrical connection terminal and a second electrical connection terminal. The first electrical connection terminal may connect with a first surface of the substrate, the second electrical connection terminal may connect with a second surface of the substrate. The second electronic element may be arranged on the second surface of the substrate and electrically connected to the second electrical connection terminal. The second electronic element may form a stack with the substrate along the first direction.

16 Claims, 4 Drawing Sheets

ELECTRONIC COMPONENT, VOLTAGE REGULATION MODULE AND VOLTAGE STABILIZER

CROSS REFERENCE TO RELATED APPLICATION

The present application is a continuation-application of International (PCT) Patent Application No. PCT/CN2021/103812 filed on Jun. 30, 2021, the entire contents of which is hereby incorporated by reference in their entireties.

TECHNICAL FIELD

The present application relates to a field of the electronic component manufacturing process, and particularly to an electronic component, a voltage regulation module and a voltage stabilizer.

BACKGROUND

As electronic components are used in much larger numbers these days, users prefer light-weight and thin electronic component products. Therefore, the arrangement and scheduling of various parts of the electronic component are getting more and more attention.

Usually, when multiple electronic elements are present at the same time, the multiple electronic elements may often be laid out on a same level, and the electronic elements may be separated by corresponding distances, such that the wirings between the electronic elements may be clearly routed, and the various electronic elements may cooperate with each other.

Conventionally, multiple electronic elements may be arranged on a same level, thus the electronic elements on the same level often occupy a large area, which can makes arrangement of the various electronic elements difficult.

SUMMARY OF THE DISCLOSURE

An electronic component, a voltage regulation module and a voltage stabilizer are provided in the present disclosure, to solve the above-mentioned issues existing in the prior art electronic component.

To solve the above-mentioned technical problem, a first technical solution adopted by the present disclosure is to provide an electronic component. The electronic component may include a substrate, a first electronic element and a second electronic element. The substrate may be provided with a first surface and a second surface that are opposite to each other. The first electronic element may be embedded in the substrate, and may be provided with a first electrical connection terminal and a second electrical connection terminal. The first electrical connection terminal may connect with a first surface of the substrate, and the second electrical connection terminal may connect with a second surface of the substrate. The second electronic element may be arranged on the second surface of the substrate and electrically connected to the second electrical connection terminal. The second electronic element and the first electronic element may form a stack along the first direction. The first direction may intersect both with the first surface and the second surface of the substrate.

Accordingly, the present disclosure may provide an electronic component, in which the second electronic element and the first electronic element may form a stack along the first direction, thereby reducing the projected area of the first electronic element and the second electronic element in a second direction intersecting with the first direction.

In some embodiments, the first electronic element of the electronic component may be a passive electronic element, and the second electronic element may include an active electronic element.

In some embodiments, the first electronic element of the electronic component may be an inductive element, the second electronic element may include a switching element.

In some embodiments, an accommodating groove may be provided within the substrate of the electronic component, and the first electronic element may be arranged in the accommodating groove, and may be electrically connected to outside devices through the first electrical connection terminal.

In some embodiments, the first surface of the substrate of the electronic component may be provided with a first electrically conductive layer, and the second surface of the substrate may be provided with a second electrically conductive layer. The substrate may further be provided with a first electrically conductive hole and a second electrically conductive hole. The first electrically conductive hole may connect with the first electrically conductive layer and the second electrically conductive hole may connect with the second electrically conductive layer. The first electrical connection terminal may be connected to the first electrically conductive layer through the first electrically conductive hole, and the second electrical connection terminal may be connected to the second electrically conductive layer through the second electrically conductive hole.

In some embodiments, the first electrical connection terminal of the electronic component may be provided on the first face of the first electronic element, and the second electrical connection terminal of the electronic component may be provided on the second face of the first electronic element. The first face and the second face of the first electronic element may be two side-surfaces opposite to each other along the first direction. The first electrically conductive hole may be provided at one end along the first direction, and may be electrically connected to the first electrical connection terminal. The second electrically conductive hole may be provided at the other end along the first direction, and may be electrically connected to the second electrical connection terminal.

In some embodiments, the first electrical connection terminal of the electronic component may be provided on the third face of the first electronic element, and the second electrical connection terminal of the electronic component may be provided on the fourth face of the first electronic element. The third face and the fourth face of the first electronic element may be two side-surfaces opposite to each other along a second direction. The second direction may intersect with the first direction. The first electrically conductive hole may be provided at one end along the first direction, and may be electrically connected to the first electrical connection terminal. The second electrically conductive hole may be provided at the other end along the first direction, and may be electrically connected to the second electrical connection terminal.

In some embodiments, a first through hole and a second through hole may be provided within the substrate of the electronic component. The first electrical connection terminal may be connected to the first electrically conductive hole through the first through hole, and the second electrical connection terminal may be connected to the second electrically conductive hole through the second through hole.

In some embodiments, the first through hole of the electronic component may be provided at one end of the first electronic element along the second direction, and the second through hole of the electronic component may be provided at the other end of the first electronic element along the second direction. The first electrical connection terminal may be connected to the first electrically conductive hole through the first through hole, and the second electrical connection terminal may be connected to the second electrically conductive hole through the second through hole. The distance between the first through hole and the first electronic component and the distance between the second through hole and the first electronic component may each be greater than or equal to 200 μm.

To solve the above-mentioned technical problem, another technical solution adopted by the present disclosure is to provide a voltage regulation module. The voltage regulation module may include a circuit board and an electronic component. A surface of the circuit board may be provided with an electrically conductive patterned layer. The electronic component may be arranged on the circuit board and electrically connected to the electrically conductive patterned layer of the circuit board. The electronic component may be the electronic component as described in the first technical solution. The second electronic element, the first electronic element and the circuit board may form a stack along the first direction sequentially, the first direction may intersect both with the first surface and the second surface of the substrate.

A groove may be provided on one side of the circuit board of the voltage regulation module close to the first surface, and the groove may be configured to partially accommodate the substrate.

An electrically conductive patterned layer may be provided on the bottom surface of the groove of the voltage regulation module, and may be configured to be electrically connected to the first electrical connection terminal.

To solve the above-mentioned technical problem, another technical solution adopted by the present disclosure is to provide a voltage stabilizer. The voltage stabilizer may also include the above-mentioned electronic component.

The advantage of the present disclosure is different from the prior art. The present disclosure may provide an electronic component, in which the second electronic element and the first electronic element may form a stack along the first direction, thereby reducing the projected area of the first electronic element and the second electronic element along a second direction intersecting with the first direction, and increasing the heat dissipation efficiency of the second electronic element.

BRIEF DESCRIPTION OF THE DRAWINGS

In order to more clearly illustrate technical solutions in the present disclosure, the drawings required in the description of the embodiments will be briefly introduced below. Obviously, the drawings in the following description are only some embodiments of the present disclosure. For those of ordinary skills in the art, other drawings may be obtained based on these drawings without creative efforts.

DETAILED DESCRIPTION

Technical solutions in embodiments of the present disclosure will be described clearly and thoroughly in connection with accompanying drawing of the embodiments of the present disclosure. Obviously, the described embodiments are only some of the embodiments, but not all of them. All other embodiments occurring to a person of ordinary skills in the art based on embodiments of the present disclosure without creative efforts, should all be within the protection scope of the present disclosure.

The terms "first", "second", "third", "fourth" and the like (if any) in the description, claims and the figures described above are used for distinguishing between similar items and are not necessarily for describing a particular sequential or chronological order. It should be understood that, the items recited in this way are interchangeable under appropriate circumstances, such that embodiments of the present disclosure described herein can for example be implemented in a sequence other than those illustrated or described herein. In addition, the terms "comprise", "include" and any variations thereof are intended to indicate a non-exclusive inclusion, for example, including a process, a method, a system, a product or an apparatus of a range of steps or units, but being not necessarily limited to those steps or units that are expressly listed, and may instead include other steps or units that are not expressly listed or inherent to the process, method, product or apparatus.

Figure 1:
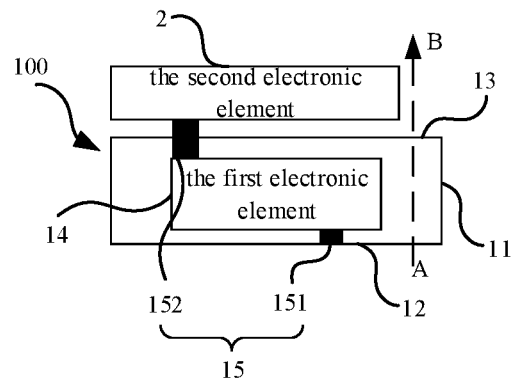
FIG. 1 is a schematic structural diagram of an electronic component, according to one embodiment of the present disclosure.

FIG. 1 is a schematic structural diagram of an electronic component according to one embodiment of the present disclosure. According to a first technical solution of the present disclosure, an electronic component 100 may be provided. The electronic component 100 may include a substrate 11, a first electronic element 14 and a second electronic element 2. The first electronic element 14 may be embedded in the substrate 11. An electrical connection terminal 15 may be disposed on the first electronic element 14. An electrical connection may be achieved between the first electronic element 14 of the substrate 11 and the second electronic element 2 through the electrical connection terminal 15.

The substrate 11 may be a package, and may be provided with a first surface 12 and a second surface 13 that are opposite to each other. A first direction AB may be further defined according to the opposite first surface 12 and second surface 13. The first direction AB may be a longitudinal direction common to those skilled in the art. The first direction AB may alternatively be another direction particularly defined as required, thereby providing a direction determination basis for the arrangement and scheduling of various elements in the electronic component 100. A may be one end of the first direction AB, and B may be the other end of the first direction AB.

The first electronic element 14 may be embedded in the substrate 11. The first electronic element 14 may be provided with a first electrical connection terminal 151 and a second electrical connection terminal 152. The first electrical connection terminal 151 may connect with the first surface 12 of the substrate 11, and the second electrical connection terminal 152 may connect with the second surface 13. In some embodiments, during the embedding of the first electronic component 14, the first electronic element 14 may be embedded in the substrate 11 conventionally. The dielectric may then be filled, and the electrical connection terminal 15 may be exposed to facilitate an electrical connection with the second electronic element 2 and an external circuit outside the electronic component 100. In some embodiments, during the embedding of the first electronic component 14, a portion of the dielectric may be filled in the substrate. The position of the first electronic element 14 in the substrate 11 may then be adjusted according to the electrical connection terminal 15, such that the first electronic element 14 may be stably embedded in the substrate 11. Dielectric may be additionally filled over the first electronic element 14, then the electrical connection terminal 15 may be exposed to facilitate an electrical connection with the second electronic element 2 and an external circuit outside the electronic component 100. Of course, one skilled in the art may also embed the first electronic element 14 in the substrate 11 in a conventional embedding manner, which is not limited here.

The second electronic element 2 of the electronic component 100 may be arranged on the second surface 13 of the substrate 11, and may be electrically connected to the second electrical connection terminal 152. In some embodiments, the second electronic element 2 may be electrically connected to the first electronic element 14 through the second electrical connection terminal 152 exposed from the second surface 13 of the substrate 11. In some embodiments, electrically conductive solder may be spot-welded or point-bond on the second surface 13 of the substrate 11. The second electrical connection terminal 152 of the first electronic element 14 may be electrically connected to the second electronic element 2 through the electrically conductive solder. The arrangement may also be conducted according to other specific conditions, and is not limited here.

The second electronic element 2 and the substrate 11 may form a stack along the first direction AB. The first direction AB may intersect both with the first surface 12 and the second surface 13 of the substrate 11. For ease of understanding and drawing, the first direction AB is shown in the figures to perpendicularly intersect with the first surface 12 and the second surface 13. Of course, the first direction AB may be defined to intersect both with the first surface 12 and the second surface 13 of the substrate 11, but not necessarily perpendicularly intersect with them, which is not limited here.

Accordingly, the present disclosure may provide an electronic component 100, in which the second electronic element 2 and the first electronic element 14 may form a stack along the first direction AB, thereby reducing the projected area of the first electronic element 14 and the second electronic element 2 in a second direction intersecting with the first direction AB, thus the second electronic element 2 may be kept far away from other circuit-devices other than the electronic component 100, and the heat dissipation efficiency of the second electronic element 2 may be improved.

Figure 2:
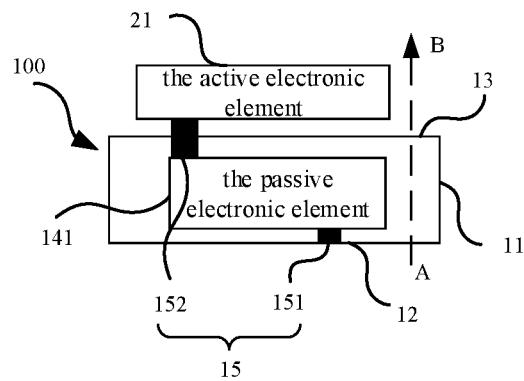
FIG. 2 is a specific schematic structural diagram of the electronic component in FIG. 1.

FIG. 2 is a specific schematic structural diagram of an electronic component of FIG. 1. The first electronic element 14 of the electronic component 100 may be a passive electronic element 141, the second electronic element 2 may include an active electronic element 21.

Specifically, the substrate 11 may be a package, and may be provided with a first surface 12 and a second surface 13 that are opposite to each other. The thickness of the substrate 11 may be between 2 mm to 4 mm, such as 2 mm, 3 mm or 4 mm. The passive electronic element 141 may be embedded in the substrate 11. The passive electronic element 141 may be provided with a first electrical connection terminal 151 connecting with the first surface 12 of the substrate 11 and a second electrical connection terminal 152 connecting with the second surface 13. The active electronic element 21 may be arranged on the second surface 13 of the substrate 11, and may be electrically connected to the second electrical connection terminal 152.

Accordingly, the present disclosure may provide an electronic component 100, in which the passive electronic element 141 may be embedded in the substrate 11, the passive electronic element 141 may be electronically connected to the active electronic element 21 and to other circuits outside the electronic component 100 through the electrical connection terminal 15. The active electronic element 21 and the substrate 11 may form a stack along the first direction AB, thereby reducing the projected area of the substrate 11 and the active electronic element 21 in the second direction perpendicularly intersecting with the first direction AB, so that the active electronic element 21 may be kept far away from other circuit devices outside the electronic component 100, and the heat dissipation efficiency of the active electronic element 21 may be improved.

Figure 3:
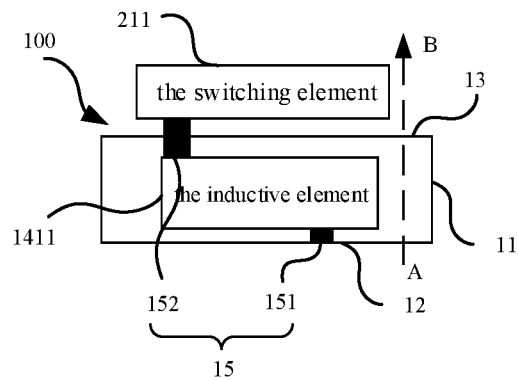
FIG. 3 is another specific schematic structural diagram of the electronic component in FIG. 1.

FIG. 3 is another specific schematic structural diagram of an electronic component of FIG. 1. The first electronic element 14 of the electronic component 100 may be an inductive element 1411, the second electronic element 2 may include a switching element 211.

Specifically, the substrate 11 may be a package, and may be provided with a first surface 12 and a second surface 13 that are opposite to each other. The inductive element 1411 may be embedded in the substrate 11. The inductive element 1411 may be provided with a first electrical connection terminal 151 and a second electrical connection terminal 152. The first electrical connection terminal 151 may connect with the first surface 12 of the substrate 11, and the second electrical connection terminal 152 may connect with the second surface 13. A switching element 211 may be provided on the second surface 13 of the substrate 11, and may be electrically connected to the second electrical connection terminal 152.

Accordingly, the present disclosure may provide an electronic component 100, in which the inductive element 1411 may be embedded in the substrate 11, and the inductive element 1411 may be electrically connected to the switching element 211 and other circuits outside the electronic component 100 through the electrical connection terminal 15. The switching element 211 and the first electronic element 14 may form a stack along the first direction AB, thereby reducing the projected area and profile of the first electronic element 14 and the switching element 211 in a second direction perpendicularly intersecting with the first direction AB. Therefore, the switching element 211 may be kept far away from other circuit devices outside the electronic component 100, and the heat dissipation efficiency of the switching element 211 may be improved.

The first electronic element embedded in the substrate 11 may be the inductive element 1411, and may also be a capacitor, a resistor and other types of elements. The specific type of the first electronic element could be selected as necessary and is not limited here. If the first electronic element is an inductive element 1411, then the electronic component may be used as a part of a voltage regulator, or may be used as an energy storage element. The inductive element selected may in some embodiments be a choke inductor, or may in some other embodiments be a chip inductor. The specific type of the inductive element is not limited here. When describing the electronic component composing the voltage regulation module later, the application of the first electronic element as an inductor will be described in detail.

Further, the first electronic element arranged on the substrate 11 along the first direction AB may be a switching element 211, such as a transistor or a MOS tube, or other semiconductor products. The specific type of the switching element may be specifically selected as required and is not limited here.

Figure 4:
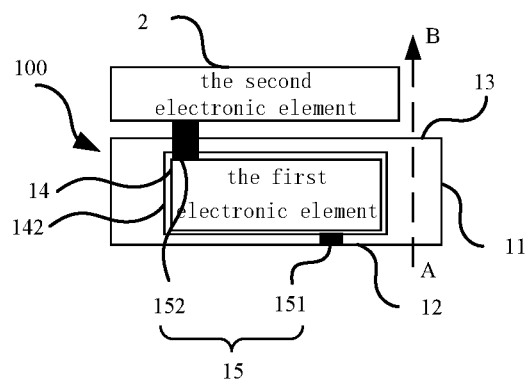
FIG. 4 is a schematic structural diagram of an electronic component, according to another embodiment of the present disclosure.

FIG. 4 is another specific schematic structural diagram of an electronic component of FIG. 1. The substrate 11 of the electronic component 100 may be provided with an accommodating groove 142. The first electronic element 14 may be arranged in the accommodating groove 142, and may be electrically connected to external devices through the first electrical connection terminal 151. When the first electronic element 14 is arranged in the accommodating groove 142, the first electronic element 14 may be embedded in the substrate 11 quickly and disposed in the substrate 11 steadily by means of the accommodating groove 142.

The first electrical connection terminal 151 of the first electronic element 14 may be led out from an end of the accommodating groove 142 along the first direction AB, such that the first electrical connection terminal 151 may be electrically connected to external circuits. The second electrical connection terminal 152 of the first electronic element 14 may be led out from the other end of the accommodating groove 142 along the first direction AB, such that the second electrical connection terminal 152 may be electrically connected to the second electronic element 2.

In some embodiments, the electrical connection terminal 15 of the first electronic element 14 may be led-out to or penetrate the first surface 12 and the second surface 13 of the substrate 11 through the surfaces of the accommodating groove 142. In some embodiments, the electrical connection terminal 15 of the first electronic element 14 may penetrate the surfaces of the accommodating groove 142 from the interior of the accommodating groove 142, and be led-out to or exposed outside of the first surface 12 and the second surface 13 of the substrate 11. Thus, there are many ways of leading-out the electrical connection terminal 15, and the specific way may be chosen as required, and is not limited here.

Figure 5:
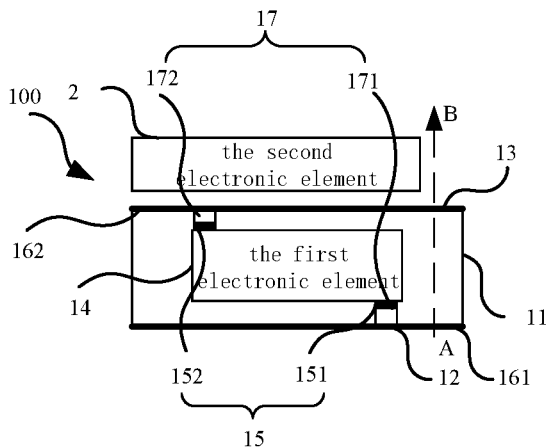
FIG. 5 is a specific schematic structural diagram of a substrate in FIG. 1.

FIG. 5 is a specific schematic structural diagram of a substrate of FIG. 1. The first surface 12 of the substrate 11 of the electronic component 100 may be provided with a first electrically conductive layer 161. In some embodiments, the first electrically conductive layer 161 may be a single piece of metal layer, such as a copper layer, an aluminum layer or a gold layer etc. In some embodiments, the first electrically conductive layer 161 may be a metal layer with an electrically conductive pattern. The second surface 13 of the substrate 11 may be provided with a second electrically conductive layer 162. Similarly, the second electrically conductive layer 162 may be a single piece of metal layer, such as a copper layer, an aluminum layer or a gold layer etc, or the second electrically conductive layer 162 may be a metal layer with an electrically conductive pattern. In some embodiments, when only one active electronic element is arranged on the second surface 13, the second electrically conductive layer 162 may be a single piece of metal layer. In some embodiments, when more than one active electronic element is arranged on the second surface 13, the second electrically conductive layer 162 may be a patterned layer.

The substrate 11 may further be provided with a first electrically conductive hole 171 and a second electrically conductive hole 172. The first electrically conductive hole 171 may communicate with the first electrically conductive layer 161, and the second electrically conductive hole 172 may communicate with the second electrically conductive layer 162. The first electrical connection terminal 151 may be connected to the first electrically conductive layer 161 through the first electrically conductive hole 171, and the second electrical connection terminal 152 may be connected to the second electrically conductive layer 162 through the second electrically conductive hole 172.

Figure 6:
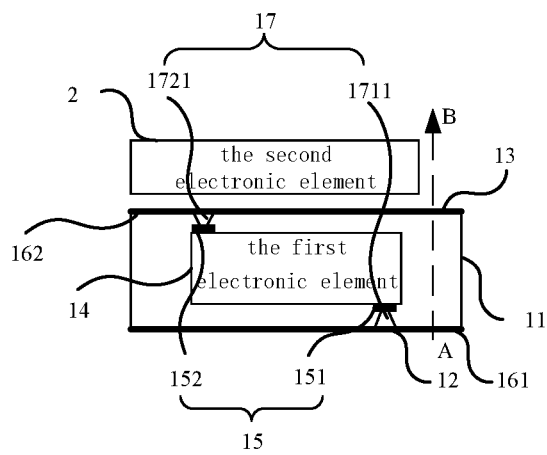
FIG. 6 is a specific schematic structural diagram of the substrate in FIG. 5, wherein a blind hole is arranged in the substrate.

FIG. 6 is a specific schematic structural diagram of a substrate of FIG. 5, wherein a blind hole is arranged in the substrate. In the embodiment as illustrated in FIG. 6, the first electrically conductive hole may be embodied as a first blind hole 1711, the second electrically conductive hole may be embodied as a second blind hole 1721. In other words, the substrate 11 may be provided with a first blind hole 1711 connecting with the first electrically conductive layer 161 and a second blind hole 1721 connecting with the second electrically conductive layer 162. The first electrical connection terminal 151 may be connected to the first electrically conductive layer 161 through the first blind hole 1711. The second electrical connection terminal 152 may be connected to the second electrically conductive layer 162 through the second blind hole 1721.

As is shown in FIG. 6, the cross section of the first blind hole 1711 along the first direction AB may be a trapezoid provided on a first face of the first electronic element 14, the cross section of the second blind hole 1721 along the first direction AB may be trapezoid provided on the second face of the first electronic element 14. Specifically, the first blind hole 1711 may be a trapezoid with a longer upper side and a shorter lower side, and may be provided on the first face or surface of the first electronic element 14. The first blind hole 1711 may directly or partly face the first electrical connection terminal 151, and may be electrically connected to the first electrical connection terminal 151. The second blind hole 1721 may be trapezoid with a shorter upper side and a longer lower side, and may be provided on the second face or surface of the first electronic element 14. The second blind hole 1721 may directly or partly face the second electrical connection terminal 152, and may be electrically connected to the second electrical connection terminal 152. Of course, the cross sections of the first blind hole 1711 and the second blind hole 1721 may have other shapes. For example, as is shown in FIG. 5, the cross section of the first blind hole 1711 and the second blind hole 1721 may also be a rectangular or a square. The size and shape of the first blind hole 1711 and the second blind hole 1721 may be identical or different, which may be chosen as required and is not limited here.

In some embodiments, the first electrical connection terminal 151 of the electronic component 100 may be provided on the first face of the first electronic element 14, and the second electrical connection terminal 152 of the electronic component 100 may be provided on the second face of the first electronic element 14. The first face and the second face of the first electronic element 14 may be two side-surfaces opposite to each other along the first direction AB. In other words, the first electrical connection terminal 151 of the electronic component 100 may be provided on the first face of the first electronic element 14 at one end A along the first direction AB, and the second electrical connection terminal 152 of the electronic component 100 may be provided on the second face of the first electronic element 14 at the other end B along the first direction AB.

The first face may be the first surface 12, or a face intersecting with the first surface 12. The second face may be the second surface 13, or a face intersecting with the second surface 13, which may be chosen as required and is not limited here.

In some embodiments, when the first direction AB is a longitudinal direction, the first electrical connection terminal 151 of the electronic component 100 may be arranged on the first electronic element 14 and may be perpendicular to the first face along the longitudinal direction, the first electrical connection terminal 151 may be within the substrate 11, the second electrical connection terminal 152 of the electronic component 100 may be arranged on the first electronic element 14 and may be perpendicular to the second face along the longitudinal direction, and the second electrical connection terminal 152 may be within the substrate 11.

Of course, the electrical connection terminal 15 may not necessarily be perpendicular to the first face and the second face. Instead, the first electrical connection terminal 151 may intersect the first face, and the second electrical connection terminal 152 may intersect the second face.

The first electrically conductive hole 171 may be defined along the first direction AB and may be electrically connected to the first electrical connection terminal 151. The second electrically conductive hole 172 may be defined along the first direction AB and may be electrically connected to the second electrical connection terminal 152. That is, the first electrically conductive hole 171 may be provided at one end A along the first direction AB, and may be electrically connected to the first electrical connection terminal 151. The second electrically conductive hole 172 may be provided at the other end B along the first direction AB, and may be electrically connected to the second electrical connection terminal 152.

Thus, when the first direction AB is along the longitudinal direction, the first electrically conductive hole 171 may be provided within the substrate 11 at the lower side along the longitudinal direction, thereby enabling electrical connection between the first electrical connection terminal 151 and the first electrically conductive hole 171 at the lower end of the first electronic element 14 at the lower side along the longitudinal direction. The second electrically conductive hole 172 may be provided within the substrate 11 at the upper side along the longitudinal direction, thereby enabling electrical connection between the second electrical connection terminal 152 and the second electrically conductive hole 172 at the upper end of the first electronic element 14 at the upper side along the longitudinal direction.

Figure 7:
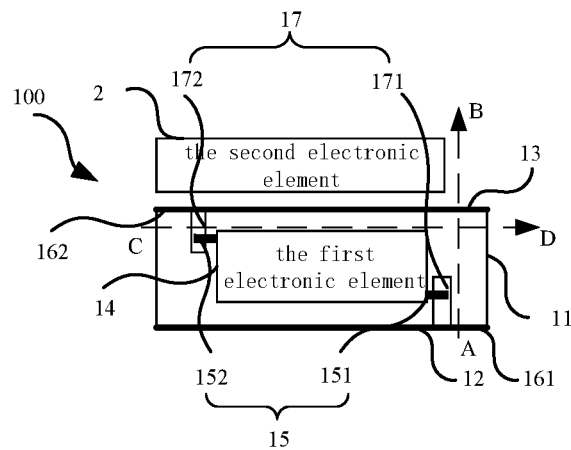
FIG. 7 is another specific schematic structural diagram of the substrate in FIG. 5, which illustrates a variety of parts within the substrate.

FIG. 7 is another specific schematic structural diagram of the various parts within the substrate. Another structure and connecting method for connecting another kind of electrical connection terminal 15 and the conductive hole 17 are illustrated. As is illustrated in FIG. 7, a second direction CD intersecting with the first direction AB may be provided. The first electrical connection terminal 151 of the electronic component 100 may be led-out from a third face or surface of the first electronic element. The second electrical connection terminal 152 of the electronic component 100 may be led-out from a fourth face or surface of the first electronic element. The third face and the fourth face of the first electronic element 14 may be two face surfaces that are opposite along the second direction CD. That is, the first electrical connection terminal 151 of the electronic component 100 may be led-out from the third face at one end D along the second direction CD, the second electrical connection terminal 152 of the electronic component 100 may be led-out from the fourth face at the other end C along the second direction CD.

The third face may be a face intersecting or perpendicularly intersecting with the first surface 12, or may be a face intersecting or perpendicularly intersecting with the first face. The fourth face may be a face intersecting or perpendicularly intersecting with the second surface 13, or may be a face intersecting or perpendicularly intersecting with the second face. The specific arrangement may be chosen as required and is not limited here.

Particularly, when the second direction CD is along a transverse direction, the first electrical connection terminal 151 of the electronic component 100 may be arranged on the first electronic element 14 and may be perpendicular to the third face along the transverse direction, the first electrical connection terminal 151 may be within the substrate 11, the second electrical connection terminal 152 of the electronic component 100 may be arranged on the first electronic element 14 and may be perpendicular to the fourth face along the transverse direction, and the second electrical connection terminal 152 may be within the substrate 11.

Of course, the electrical connection terminals 15 may not necessarily arranged to be perpendicular to the third face and the fourth face. Instead, the first electrical connection terminal 151 may interact the third face, the second electrical connection terminal 152 may interact the fourth face.

Specifically, the second direction CD may be defined to perpendicularly intersect the first direction AB. The first electrically conductive hole 171 may be defined along the first direction AB and may be electrically connected to the first electrical connection terminal 151. The second electrically conductive hole 172 may be defined along the first direction AB and may be electrically connected to the second electrical connection terminal 152. That is, the first electrically conductive hole 171 may be provided at one end A along the first direction AB, and may be electrically connected to the first electrical connection terminal 151. The second electrically conductive hole 172 may be provided at the other end B along the first direction AB, and may be electrically connected to the second electrical connection terminal 152.

Thus, when the first direction AB is along the longitudinal direction or the vertical direction, and the second direction CD is along the transverse direction or the horizontal direction, the first electrically conductive hole 171 may be provided within the substrate 11 at the lower side of the substrate 11 along the longitudinal direction, thereby enabling an electrical connection between the first electrical connection terminal 151 and the first electrically conductive hole 171 at the lower end of the first electronic element 14, with the lower end of the first electronic element 14 on the lower side along the longitudinal direction. The second electrically conductive hole 172 may be provided within the substrate 11 at the upper side of the substrate 11 along the longitudinal direction, thereby enabling an electrical connection between the second electrical connection terminal 152 and the second electrically conductive hole 172 at the upper end of the first electronic element 14, the upper end of the first electronic element 14 is at the upper side along the longitudinal direction.

Figure 8:
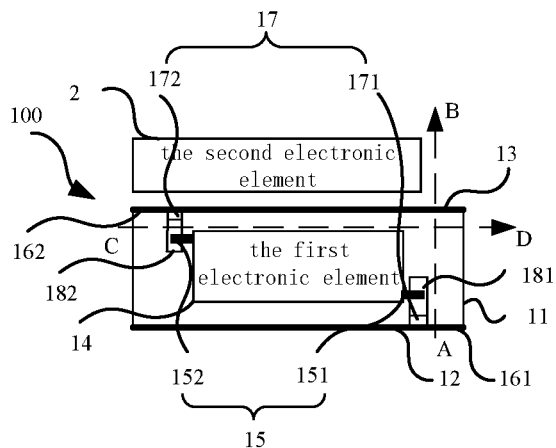
FIG. 8 is a specific schematic structural diagram of the substrate in FIG. 7, wherein a through hole is arranged in the substrate.

FIG. 8 is a specific schematic structural diagram of a substrate of FIG. 7, wherein through holes are arranged in the substrate. A first through hole 181 and a second through hole 182 may be defined in the substrate 11. The first through hole 181 and the second through hole 182 may be arranged along the first direction AB. The first electrical connection terminal 151 may be electrically connected to the first electrically conductive hole 171 through the first through hole 181. The second electrical connection terminal 152 may be electrically connected to the second electrically conductive hole 172 through the second through hole 182.

Specifically, on the one hand, the first through hole 181 may be defined close to one end A of the first direction AB, and the second through hole 182 may be defined close to the other end B of the first direction AB. The first electrical connection terminal 151 may be connected to the first electrically conductive hole 171 through the first through hole 181. The second electrical connection terminal 152 may be connected to the second electrically conductive hole 172 through the second through hole 182.

In order to enable the electrical connection terminal 15 to connect with the conductive hole 17 and further to connect with the first surface 12 or the second surface 13 on the substrate 11 through the through hole 18, i.e., to enable the electrical connection terminal 15 to conduct with the electrically conductive metal layer or electrically conductive patterned layer on the substrate 11 on one side, the first through hole 181 may be electrically connected to the first surface 12 on the substrate 11 by connecting with the first electrically conductive hole 171, but the first through hole 181 may not penetrate through the substrate 11, thereby allowing the first through hole 181 to conduct with the first surface 12 on one side. Similarly, the second through hole 182 may be electrically connected to the second surface 13 on the substrate 11 by connecting with the second electrically conductive hole 172, but the second through hole 182 may not penetrate through the substrate 11, thereby allowing the second through hole 182 to conduct with the second surface 13 on one side.

Further, on the one hand, the first through hole 181 may be arranged at one end D of the first electronic element 14 along the second direction CD, the second through hole 182 may be arranged at the other end C of the first electronic element 14 along the second direction CD. The first electrical connection terminal 151 may be connected to the first electrically conductive hole 171 through the first through hole 181, and the second electrical connection terminal 152 may be connected to the second electrically conductive hole 172 through the second through hole 182.

In order to better arrange the electrical connection terminal 15 of the first electronic element 14, the first electrical connection terminal 151 and the second electrical connection terminal 152 may be exposed from the first electronic element 14. In one example, the first electrical connection terminal 151 and the second electrical connection terminal 152 may extend at least to a position beyond the surface of the first electronic element 14 by 100 μm, such as a position beyond the surface of the first electronic element 14 by 100 μm to 120 μm. The distance between the first electronic element 14 and the first through hole 181 and the distance between the first electronic element 14 and the second through hole 182 may be greater than or equal to 200 μm. In this way, the first electrical connection terminal 151 and the first through hole 181 may be electrically connected to each other by point-soldering or spot-soldering, the second electrical connection terminal 152 and the second through hole 182 may be electrically connected to each other by point-soldering or spot-soldering.

Figure 9:
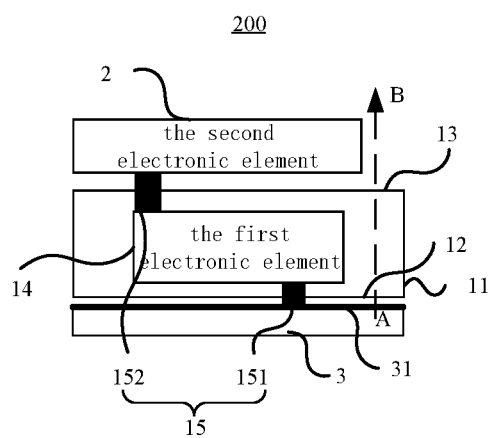
FIG. 9 is a schematic structural diagram of a voltage regulation module, according to another embodiment of the present disclosure.

Further, to solve the above-mentioned technical problem, another technical solution adopted by the present disclosure may be to provide a voltage regulation module. FIG. 9 is a schematic structural diagram of a voltage regulation module according to another embodiment of the present disclosure. The voltage regulation module 200 may include a circuit board 3 and an electronic component 100 as described above. The electronic component 100 may be electrically connected to the circuit board 3.

Specifically, an electrically conductive patterned layer 31 may be arranged on the circuit board 3. The electrically conductive patterned layer 31 may be electrically connected to the electronic component 100 through the electrical connection terminal 15. In this way, the electronic component 100 may be arranged on the circuit board 3 and be electrically connected to the electrically conductive patterned layer 31 of the circuit board 3. The electronic component 100 may be the electronic component as described above.

The second electronic element 2, the first electronic element 14 and the circuit board 3 may form a stack along the first direction AB sequentially. The first direction AB may intersect both with the first surface 12 and the second surface 13 of the substrate 11. Specifically, as is illustrated in FIG. 8, the first direction AB may perpendicularly intersect both with the first surface 12 and the second surface 13 of the substrate 11.

Accordingly, the present disclosure may provide a voltage regulation module 200, in which the second electronic component 2, the first electronic element 14 and the circuit board 3 may form a stack along the first direction AB sequentially, thereby reducing the projected area and profile of the second electronic component 2, the first electronic element 14 and the circuit board 3 in the second direction CD. The second direction CD intersects with the first direction AB. In this way, the second electronic component 2 may be kept far away from other electronic means outside the electronic component 100. For example, the second electronic component 2 may be kept far away from the circuit board 3, thereby enhancing the heat dissipation efficiency of the second electronic element 2.

Figure 10:
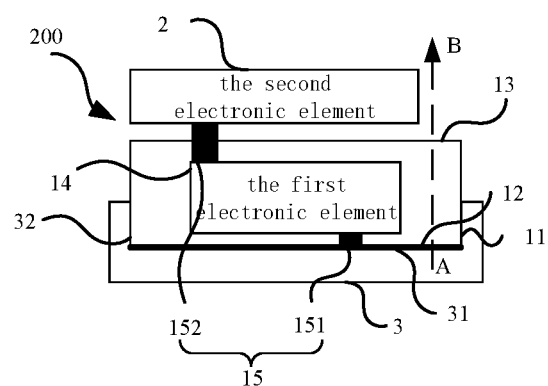
FIG. 10 is a specific schematic structural diagram of the voltage regulation module in FIG. 9.

FIG. 10 is a specific schematic structural diagram of a voltage regulation module 200 of FIG. 9. The circuit board 3 may be provided with a groove 32 on a side close to the first surface 12. The groove 32 may be configured to partially accommodate the substrate 11. Specifically, the electrically conductive patterned layer 31 may be arranged on the bottom surface of the groove 32, and may be configured to electrically connect to the first electrical connection terminal 151.

When there are multiple electronic components 100, the multiple electronic components 100 may all be arranged in the circuit board 3. In some embodiments, the groove 32 arranged on the circuit board 3 may be configured to partially accommodate the substrate 11 of an electronic component 100. In some embodiments, the substrates 11 of some electronic components 100 may be partially accommodated in the circuit board 3. In some embodiments, the substrates of all the electronic components 100 may be partially accommodated in the circuit board 3. The specific arrangement may be specifically selected as required and is not limited here.

In some embodiments, the first electronic element 14 of the electronic component 100 may be an inductive element, and the second electronic element 2 may include a switching element. For an inductor application in which the electronic component 100 forms a voltage regulation module 200, the inductive element may be a part of the electronic component 100 used as a voltage regulation module 200, or may be used as an energy storage element. In a case of the voltage regulation module 200, the inductive element chosen may be a choke inductor or a chip inductor.

When the inductive element is a choke inductor, the inductive element may be integrally formed and may be a packaged shielded inductor. When the voltage regulation module 200 is electrically connected to an external power supply and a load, and the voltage across the load decreases, the external power supply may charge the choke inductor through the switching element, so that the load may obtain the required rated voltage. When the voltage across the load electrically connected to the voltage regulation module 200 increases, the choke inductor is disconnected from the external power supply through the switching action of the switching element to release energy, and the external power supply continues to power the load.

In case the inductive element is a chip inductor, when the voltage regulation module 200 is electrically connected to an external power supply and a load, and the voltage across the load decreases, the external power supply may charge the chip inductor through the switching element, so that the load may obtain the required rated voltage. When the voltage across the load electrically connected to the voltage regulation module 200 increases, the chip inductor may be disconnected from the external power supply through the switching action of the switching element to release energy, and the external power supply continues to power the load.

According to the above-mentioned technical solution, in the present disclosure, the inductive element 1411 is embedded in a Printed Circuit Board (PCB), a chip including a transistor may be exposed from the PCB, arranged above the inductive element 1411 and may be designed and constructed in a longitudinally stacked manner. A heat sink or a heat dissipating component may be arranged on the chip, facilitating the elimination of the heat dissipation effect of the voltage regulation module 200. Although the thickness of the voltage regulation module 200 along the first direction AB may be increased, but the manufacturing area thereof along the second direction CD may be reduced. In addition, considering that the blind hole is limited by the dielectric thickness, the increased thickness of the voltage regulation module 200 in the first direction AB may be conducive to better setting the blind hole.

Along the first direction AB, the first electronic element 14 arranged on the substrate 11 may be an inductive element. A switching element 211 such as a transistor or a MOS tube and other semiconductor element product such as a capacitor or PMIC may be arranged on the inductive element. When the circuit board is a PCB mother board, the first electronic element 14 may be sunk into the PCB mother board. A PMIC, a resistor or a capacitor may be surface-mounted on the inductive element. The outer surfaces of the PMIC, the resistor and the capacitor may be treated for heat dissipation. If the PMIC is a plastic-package means, then the PMIC does not need to be re-plastic-packaged.

In addition, regarding the power density U, which may be calculated by U=P/S, since the area S in the first direction AB decreases, if the power P of the voltage regulation module 200 remains unchanged, then the heat dissipation performance of the second electronic element 2 is improved because of that, and the computing power of the voltage regulation module 200 is increased. In other words, the number of on and off frequencies of the Insulated Gate Bipolar Transistor (IGBT) in the second electronic component is increased. IGBT is a composite fully-controlled voltage-driven power semiconductor device composed of a bipolar transistor (BJT) and an insulated gate field effect transistor (MOS), and has the advantages of both the BJT and the MOS. The IGBT may greatly increase the power density of the voltage regulation module 200, improve the working performance of the voltage regulation module 200, and may have a wide range of applications in the fields of CPU and GPU.

Figure 11:
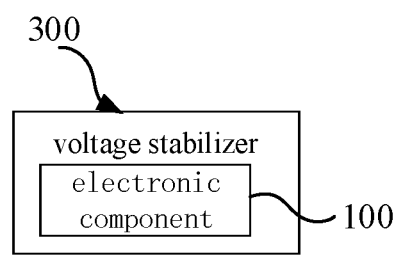
FIG. 11 is a schematic structural diagram of a voltage stabilizer, according to another embodiment of the present disclosure.

To solve the above-mentioned technical problem, another technical solution adopted by the present disclosure is to provide a voltage stabilizer 300. FIG. 11 is a schematic structural diagram of a voltage stabilizer according to another embodiment of the present disclosure. The voltage stabilizer 300 may include the above-mentioned electronic component 100.

The above are only implementations of the present disclosure, and do not limit the patent scope of the present disclosure. Any equivalent changes that are made to the structure or processes in the description and drawings of this application or used directly or indirectly in other related technical field are included in the protection scope of this application.

What is claimed is:

1. An electronic component, comprising: a substrate, comprising a first surface and a second surface that are opposite to each other; a first electronic element, embedded in the substrate and provided with a first electrical connection terminal and a second electrical connection terminal, the first electrical connection terminal connects with the first surface of the substrate, the second electrical connection terminal connects with the second surface of the substrate; and a second electronic element, arranged on the second surface of the substrate and electrically connected to the second electrical connection terminal; wherein, the second electronic element and the first electronic element form a stack along a first direction, and the first direction intersects both a first face and a second face of the substrate; wherein the first surface of the substrate is provided with a first electrically conductive layer, the second surface of the substrate is provided with a second electrically conductive layer, the substrate is further provided with a first electrically conductive hole and a second electrically conductive hole, the first electrically conductive hole connects with the first electrically conductive layer, the second electrically conductive hole connects with the second electrically conductive layer, the first electrical connection terminal is connected to the first electrically conductive layer through the first electrically conductive hole, and the second electrical connection terminal is connected to the second electrically conductive layer through the second electrically conductive hole; and wherein the first electrical connection terminal is led-out from a third face of the first electronic element, the second electrical connection terminal is led-out from a fourth face of the first electronic element, the third face and the fourth face of the first electronic element are two side-surfaces opposite to each other along a second direction, the second direction intersects with the first direction, the first electrically conductive hole is provided at one end along the first direction, and is electrically connected to the first electrical connection terminal; the second electrically conductive hole is provided at the other end along the first direction, and is electrically connected to the second electrical connection terminal.

2. The electronic component as claimed in claim 1, wherein the first electronic element is a passive electronic element, and the second electronic element is an active electronic element.

3. The electronic component as claimed in claim 2, wherein the first electronic element is an inductive element, and the second electronic element comprises a switching element.

4. The electronic component as claimed in claim 1, wherein an accommodating groove is defined in the substrate, and the first electronic element is arranged in the accommodating groove, and is electrically connected to external devices through the first electrical connection terminal.

5. The electronic component as claimed in claim 1, wherein the first electrical connection terminal is provided on the first face of the first electronic element, the second electrical connection terminal is provided on the second face of the first electronic element, the first face and the second face of the first electronic element are two opposite side-surfaces along the first direction, the first electrically conductive hole is provided at one end along the first direction, and is electrically connected to the first electrical connection terminal, and the second electrically conductive hole is provided at the other end along the first direction, and is electrically connected to the second electrical connection terminal.

6. The electronic component as claimed in claim 1, wherein a first through hole and a second through hole are provided within the substrate, the first electrical connection terminal is connected to the first electrically conductive hole through the first through hole, and the second electrical connection terminal is connected to the second electrically conductive hole through the second through hole.

7. The electronic component as claimed in claim 6, wherein the first through hole is provided at one end of the first electronic element along the second direction, and the second through hole is provided at the other end of the first electronic element along the second direction, the first electrical connection terminal is connected to the first electrically conductive hole through the first through hole, and the second electrical connection terminal is connected to the second electrically conductive hole through the second through hole; wherein, the distance between the first through hole and the first electronic component and the distance between the second through hole and the first electronic component are each greater than or equal to 200 μm.

8. A voltage regulation module, comprising: a circuit board, a surface of which is provided with an electrically conductive patterned layer; and an electronic component, arranged on the circuit board and electrically connected to the electrically conductive patterned layer of the circuit board; the electronic component comprises: a substrate, comprising a first surface and a second surface that are opposite to each other; a first electronic element, embedded in the substrate and provided with a first electrical connection terminal and a second electrical connection terminal, the first electrical connection terminal connects with the first surface of the substrate, the second electrical connection terminal connects with the second surface of the substrate; and a second electronic element, arranged on the second surface of the substrate and electrically connected to the second electrical connection terminal, wherein, the second electronic element, the first electronic element and the circuit board form a stack along a first direction sequentially, the first direction intersects both with the first surface and the second surface of the substrate; wherein the first surface of the substrate is provided with a first electrically conductive layer, the second surface of the substrate is provided with a second electrically conductive layer, the substrate is further provided with a first electrically conductive hole and a second electrically conductive hole, the first electrically conductive hole connects with the first electrically conductive layer, the second electrically conductive hole connects with the second electrically conductive layer, the first electrical connection terminal is connected to the first electrically conductive layer through the first electrically conductive hole, and the second electrical connection terminal is connected to the second electrically conductive layer through the second electrically conductive hole; and wherein the first electrical connection terminal is led-out from a third face of the first electronic element, the second electrical connection terminal is led-out from a fourth face of the first electronic element, the third face and the fourth face of the first electronic element are two side-surfaces opposite to each other along a second direction, the second direction intersects with the first direction, the first electrically conductive hole is provided at one end along the first direction, and is electrically connected to the first electrical connection terminal; the second electrically conductive hole is provided at the other end along the first direction, and is electrically connected to the second electrical connection terminal.

9. The voltage regulation module as claimed in claim 8, wherein the first electronic element is a passive electronic element, and the second electronic element is an active electronic element.

10. The voltage regulation module as claimed in claim 9, wherein the first electronic element is an inductive element, and the second electronic element comprises a switching element.

11. The voltage regulation module as claimed in claim 8, wherein an accommodating groove is defined in the substrate, and the first electronic element is arranged in the accommodating groove, and is electrically connected to external devices through the first electrical connection terminal.

12. The voltage regulation module as claimed in claim 8, wherein the first electrical connection terminal is provided on the first surface of the first electronic element, the second electrical connection terminal is provided on the second surface of the first electronic element, the first surface and the second surface of the first electronic element are two opposite side-surfaces along the first direction, the first electrically conductive hole is provided at one end along the first direction, and is electrically connected to the first electrical connection terminal, and the second electrically conductive hole is provided at the other end along the first direction, and is electrically connected to the second electrical connection terminal.

13. The voltage regulation module as claimed in claim 8, wherein a first through hole and a second through hole are provided within the substrate, the first electrical connection terminal is connected to the first electrically conductive hole through the first through hole, and the second electrical connection terminal is connected to the second electrically conductive hole through the second through hole.

14. The voltage regulation module as claimed in claim 8, wherein a groove is provided on one side of the circuit board close to the first surface, and the groove is configured to partially accommodate the substrate.

15. The voltage regulation module as claimed in claim 14, wherein an electrically conductive patterned layer is provided on a bottom surface of the groove, and is configured to be electrically connected to the first electrical connection terminal.

16. A voltage stabilizer, comprising an electronic component, the electronic component comprises: a substrate, comprising a first surface and a second surface that are opposite to each other; a first electronic element, embedded in the substrate and provided with a first electrical connection terminal and a second electrical connection terminal, the first electrical connection terminal connects with the first surface of the substrate, the second electrical connection terminal connects with the second surface of the substrate; and a second electronic element, arranged on the second surface of the substrate and electrically connected to the second electrical connection terminal; wherein, the second electronic element and the first electronic element form a stack along a first direction, the first direction intersects with both the first surface and the second surface of the substrate; wherein the first surface of the substrate is provided with a first electrically conductive layer, the second surface of the substrate is provided with a second electrically conductive layer, the substrate is further provided with a first electrically conductive hole and a second electrically conductive hole, the first electrically conductive hole connects with the first electrically conductive layer, the second electrically conductive hole connects with the second electrically conductive layer, the first electrical connection terminal is connected to the first electrically conductive layer through the first electrically conductive hole, and the second electrical connection terminal is connected to the second electrically conductive layer through the second electrically conductive hole; and wherein the first electrical connection terminal is led-out from a third face of the first electronic element, the second electrical connection terminal is led-out from a fourth face of the first electronic element, the third face and the fourth face of the first electronic element are two side-surfaces opposite to each other along a second direction, the second direction intersects with the first direction, the first electrically conductive hole is provided at one end along the first direction, and is electrically connected to the first electrical connection terminal; the second electrically conductive hole is provided at the other end along the first direction, and is electrically connected to the second electrical connection terminal.

* * * * *